United States Patent [19]
Keefe et al.

[11] 3,988,722
[45] Oct. 26, 1976

[54] SINGLE SIDED, HIGH DENSITY BUBBLE DOMAIN PROPAGATION DEVICE

[75] Inventors: George E. Keefe, Montrose; Mark H. Kryder, Yorktown Heights; Yeong S. Lin, Mount Kisco, all of N.Y.

[73] Assignee: International Business Machines Corporation, Armonk, N.Y.

[22] Filed: Dec. 31, 1974

[21] Appl. No.: 537,804

[52] U.S. Cl. .......................................... 340/174 TF
[51] Int. Cl.² .......................................... G11C 11/14
[58] Field of Search ................. 340/174 TF, 174 SR

[56] References Cited
UNITED STATES PATENTS

| | | | |
|---|---|---|---|
| 3,503,054 | 3/1970 | Bobeck et al. | 340/174 TF |
| 3,702,991 | 11/1972 | Bate et al. | 340/174 TF |
| 3,824,568 | 7/1974 | Fischer et al. | 340/174 TF |
| 3,828,329 | 8/1974 | Fischer et al. | 340/174 TF |

*Primary Examiner*—James W. Moffitt
*Attorney, Agent, or Firm*—Jackson E. Stanland

[57] ABSTRACT

A magnetic bubble domain propagation device which is single sided and can be used to move bubble domains in amorphous magnetic films. The propagation structure is comprised of either one or two layers located on a single side of the amorphous magnetic medium. Preferably, the propagation elements in each layer are contiguous to one another to provide maximum density. In a preferred embodiment, the propagation elements are circular, but other geometries can be used. The amorphous magnetic material is deposited over these underlayer propagation elements in order to create a change in the profile of the amorphous material. This change in profile of the amorphous material acts as a restraining barrier to bubble domain movement, so that the bubble domains will move along the proper channel without drifting to other propagation channels, and will move from one propagation element to the next without merely idling at any of the propagation elements.

12 Claims, 19 Drawing Figures

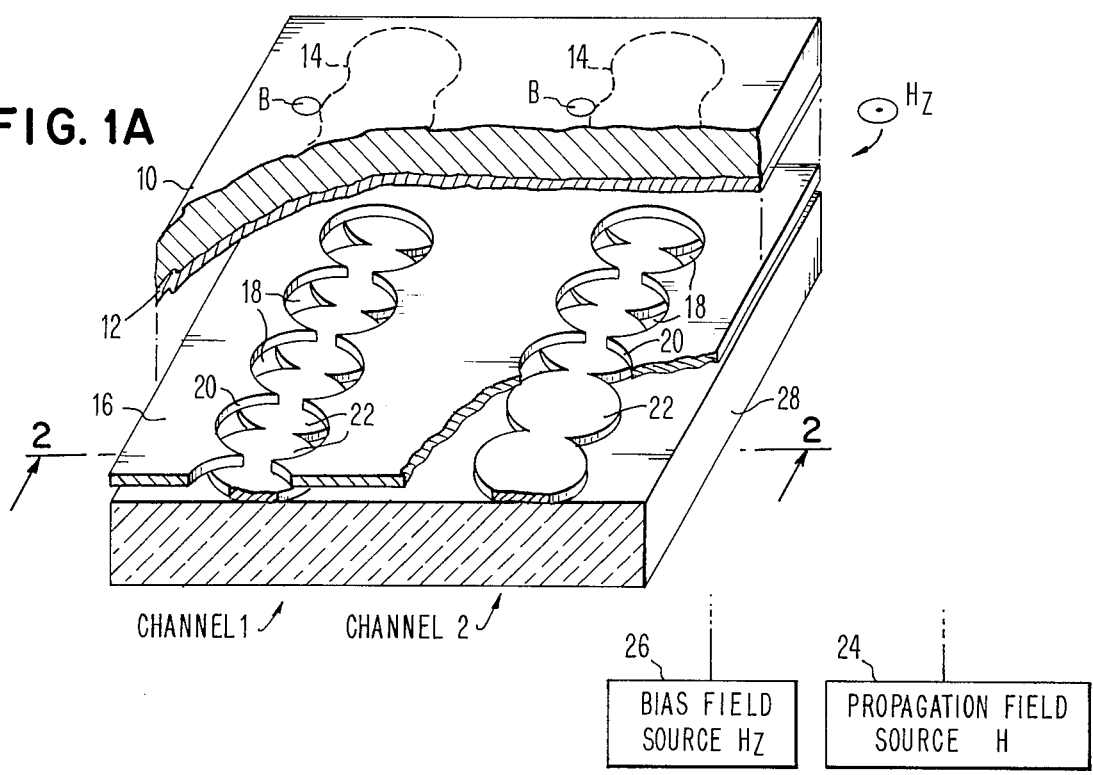
FIG. 1A
FIG. 1B
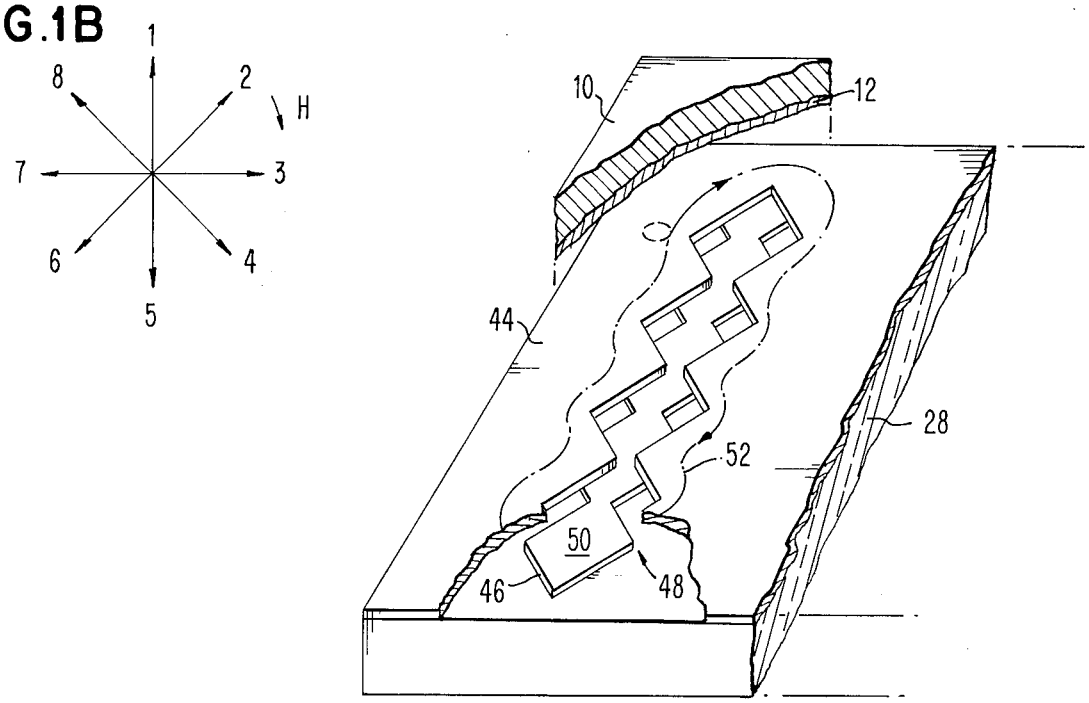
FIG. 4

SINGLE SIDED, HIGH DENSITY BUBBLE DOMAIN PROPAGATION DEVICE

BACKGROUND OF THE INVENTION

1. Field of the Invention

This invntion relates to single sided, high density bubble domain propagation structures, and particularly to a propagation structure used for high density propagation of bubble domains in amorphous magnetic material.

2. Description of the Prior Art

Several copending applications Ser. Nos. 429,018, 429,001 now U.S. Pat. No. 3,914,751, 429,000 U.S. Pat. No. 3,925,768 and 428,972 and now abandoned, all of which were filed Dec. 27, 1973, describe single sided and double sided structures comprised of gapless propagation structures for movement of magnetic bubble domains in a magnetic medium. Additionally, the use of ion implanted disk structures has been described by R. Wolfe et al in the AIP Conference Proceedings, No. 10, Part 1, pg. 339 (1973), ), which Proceedings contain the text of the papers presented at the 18th Annual Conference on Magnetism and Magnetic Materials, held in Denver, Colo., in 1972.

Ion implanted structures are not practical with amorphous magnetic materials since the amorphous structure is often damaged during the ion implantation. Also, there is difficulty in implanting such materials, which is believed due to the high magnetization of these materials. Generally, it is very difficult to obtain implanted layers having in-plane magnetization.

Since ion implantation does not appear to be useful for providing propagation structures for use with amorphous magnetic materials, magnetic overlays and underlays appear to be most preferable. One possibility is the use of a magnetic layer which has apertured propagation elements therein. For instance, a layer of permalloy can have disk-shaped apertures therein for movement of the bubble domains in response to reorientations of an in-plane magnetic field. However, it has been found that such a structure will not provide good bubble domain propagation, since bubble domains often drift from one channel of propagation elements to an adjacent channel of propagation elements, rather than staying along the boundary of their initial propagation channel.

Another type of propagation structure which is possible for bubble domain propagation in amorphous materials is a structure comprising disks of magnetic materials, such as permalloy, which are adjacent to one another. However, it has often been found that bubble domains will not transfer from one magnetic disk to the adjacent magnetic disk as the in-plane magnetic field rotates. Instead, bubbles often tend to keep traveling in circular paths around individual disks during the field reorientations, rather than sequentially transferring from one disk to the next as is required for proper motion.

In order to alleviate the aforementioned problems, the present invention uses a two-layered propagation structure for movement of magentic bubble domains. Although two-layer propagation structures have been known in the art, such structures were not comprised of contiguous propagation elements for high density storage and/or have exhibited one or both of the problems mentioned previously. For instance, U.S. Pat. No. 3,797,001 describes a propagation pattern using embossed elements in two levels. However, these are not contiguous propagation element which exhibit high density storage.

Another propagation structure known in the art is described in U.S. Pat. No. 3,516,077. This propagation structure is comprised of an overlayer of magnetic material and an underlayer of magnetic material, the overlayer and the underlayer being comprised of disk-shaped elements which are separated from one another. This is a double-sided structure which is disadvantageous from a fabrication standpoint, and also suffers from the problem of bubble domains continually circulating around any one of the disks rather than moving from one disk to the next.

U.S. Pat. No. 3,540,019 describes a propagation pattern using etched patterns in a permalloy layer. These are not contiguous elements which will provide high density.

U.S. Pat. No. 3,599,190 describes a laminated propagation structure in which different coercivity materials are used. Different coercivity materials used in combination with permalloy will cause a change in magnetic pole pattern in order to propagate the bubble domains in a desired direction. In contrast with this, the present propagation structure can use the same material in each of the propagation layers in order to facilitate fabrication. Also, the present invention is directed to a high density structure in contrast with this prior art patent.

As is apparent from the foregoing description, the prior art has presented numerous variations in the geometry of the propagation elements used for bubble domain movement and has provided underlayer and overlayer structures. However, high density structures having particular utility for movement of bubble domains in amorphous magnetic materials have not been widely presented, and in particular the problems described previously have not been sufficiently addressed. In contrast with this, the present propagation structure has been demonstrated in the laboratory to provide reliable, high density propagation and is single sided for fabrication ease.

Accordingly, it is a primary object of the present invention to provide a high density propagation structure for reliable bubble domain propagation.

It is a further object of this invention to provide a high density bubble domain propagation structure for movement of magnetic bubble domains in amorphous magnetic materials.

It is another object of this invention to provide a high density propagation structure for moving bubble domains in an amorphous magnetic material, where the propagation structure can be fabricated using a minimum number of masking steps.

It is a still further object of this invention to provide a single sided propagation structure for moving magnetic bubble domains in a magnetic medium, where the propagation elements themselves can have various geometries.

It is another object of this invention to provide a high density, single sided propagation structure for moving magnetic bubble domains in a magnetic medium, where the bubble domains do not drift away from the desired propagation channel and do not continually circulate without moving in a desired direction along the channel.

BRIEF SUMMARY OF THE INVENTION

This propagation structure is designed particularly for movement of magnetic bubble domains in amorphous magnetic materials. It is a structure comprised of two layers, both of which are on the same side of the amorphous magnetic medium in which the bubble domains exist and are moved.

Each of the layers comprising the propagation structure is comprised of a magnetic material (preferably magnetically soft) and defines propagation elements along which magnetic poles can be created for the attraction and/or repulsion of bubble domains in the amorphous material. The relative positions of the two propagation layers can be reversed with respect to one another.

One propagation layer is comprised of a layer of magnetic material in which edges of apertures define the individual propagation elements. Preferably, the apertures defining the propagation elements are contiguous with one another to provide a high density structure.

The other propagation layer is comprised of a layer of magnetic material which defines individual propagation elements. The propagation elements in this second magnetic layer of preferably contiguous to one another, again for the reason of high density propagation. Thus, the propagation elements in the first magnetic layer are the edges of the apertures formed in this layer and the bubble domains follow the edges of the apertures during their motion. However, the propagation elements in the second magnetic layer are solid magnetic elements and the bubble domains propagate around the edges of these solid elements. Magnetic poles are created along the propagation elements in the two layers in response to the reorientation of a magnetic field in the plane of the magnetic layers. Preferably, this is a rotating magnetic field as is well known in the art.

The individual propagation elements in the two magnetic propagation layers are spatially displaced from one another, a preferred (but not required) displacement being one-half the diameter (width) of the propagation elements themselves. The propagation elements, while preferably having curved geometries which are circular, can have a variety of geometries including triangular shapes, circles, etc.

The amorphous magnetic material is deposited over the two propagation layers, or over a non-magnetic layer located over the propagation layers. Due to the edges of the propagation elements in the propagation layers, discontinuities in the profile of the amorphous magnetic material will be produced. These discontinuities keep magnetic bubble domains in the amorphous material from moving from one propagation channel to an adjacent propagation channel as the in-plane magnetic field rotates. Further, magnetic bubble domains are prevented from merely idling around any propagation element, instead of transferring from one propagation element to the next, as is required for proper bubble domain movement.

This invention is particularly suited for amorphous magnetic materials, which are not crystalline in structure and which do not require perfect substrates. Thus, the amorphous magnetic materials can be deposited directly over the propagation layers even though these do not provide a perfectly smooth surface. Consequently, the substrate is used in the present case to create the discontinuity in the amorphous magnetic material which in turn provides the proper restrictive channel for magnetic bubble domain motion in a high density structure. In this manner, the problems described previously with respect to prior art high density structures are alleviated in amorphous magnetic material devices.

These and other objects, features, and advantages will become more apparent from the following more particular description of the preferred embodiments.

BRIEF DESCRIPTION OF THE DRAWINGS

FIG. 1A is a top view of the propagation structure of the present invention while FIG. 1B is a schematic drawing of the various orientations of the in-plane magnetic field H used with the structure of FIG. 1A to move domains in the magnetic medium.

FIGS. 2A–2H show one technique for making the structure of FIG. 1A, while

FIG. 4 shows an alternate geometry for the propagation elements.

Figure 2A:
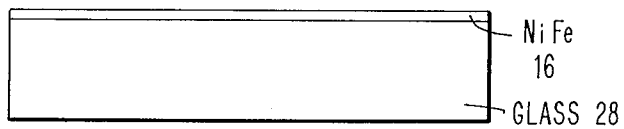

DETAILED DESCRIPTION OF THE PREFERRED EMBODIMENTS PROPAGATION STRUCTURE FIGS. 1A AND 1B

The high density propagation structure of the present invention comprises two layers of propagation elements, both of which are located on the same side of the amorphous magnetic material in which the bubble domains exist. These layers are comprised of magnetic elements, as for instance NiFe. In a preferred embodiment, the magnetic elements may be comprised of, for instance, permalloy. As will be seen in more detail later, the propagation element layers are located beneath the amorphous magnetic film and will cause a non-uniformity in the profile of the amorphous film when it is deposited over the propagation layers. This change in profile acts as a restraining barrier for the movement of magnetic bubble domains in the amorphous film, and serves to prevent the domains from straying from one propagation channel to the next.

Referring more particularly now to FIG. 1A, an amorphous magnetic medium 10 has a plurality of propagation channels 1 and 2 thereon. The amorphous magnetic material is described in the art, as can be seen by referring to P. Chaudhari et al, IBM Journal of Research & Development, 17, 66 (1973). An example of a useful amorphous magnetic material is one comprised of a transition metal element and a rare earth element, such as GdCo. These materials are characterized by uniaxial anisotropy normal to the plane of the material, amorphous structural properties, and long range magnetic ordering in which the anisotropy is non-crystalline.

In FIG. 1A, the generator used to produce magnetic domains and the sensors used to sense these domains are not shown. These are well known components in the magnetic bubble domain art, and they are not shown here, since the present invention is specifically directed to high density propagation structures.

Referring more particularly now to FIG. 1A, a magnetic medium 10 in which bubble domains exist and can be propagated is located over the propagation structure, shown here as propagation channel 1 and propagation channel 2. The magnetic medium 10 is an amorphous magnetic medium such as GdCo.

Located directly below magnetic material 10 is a non-magnetic insulating layer 12, such as $SiO_2$. Layer 12 need not be provided in all cases, but it is sometimes preferable to use this layer to remove the magnetic propagation elements farther from the amorphous material in order to prevent spontaneous nucleation of domains in magnetic material 10 during movement of the domains by the propagation elements.

Although it is not shown in FIG. 1A, a patterned conductive layer can be provided directly below or above insulating layer 12, or above amorphous layer 10. This conductive layer would be used to provide functions such as domain generation, domain transfer, and domain sensing, as is well known in the art.

Channels 1 and 2 are comprised of similar elements; consequently, they will be described together. Each propagation channel is comprised of two magnetic layers: an apertured magnetically soft layer and a layer of magnetically soft disk-shaped elements. As will be apparent later, the geometries of the individual propagation elements in each layer can be changed. However, for a high density propagation structure, these elements are contiguous to one another and provide a continuum of magnetic poles along the peripheries of the elements as an in-plane magnetic field H (FIG. 1B) reorients in the plane of magnetic medium 10. Thus, domains in each propagation channel will follow a path generally indicated by path 14.

The two layers comprising each propagation channel can have their relative positions interchanged. In FIG. 1A, the top-most layer is a magnetic layer 16 having apertures 18 therein. For maximum density, these apertures are contiguous with one another. In FIG. 1A, the apertures are generally curved, circular-type elements, although this can be varied as will be seen later. Consequently, layer 16 is comprised of a magnetically soft material having apertures 18 therein which are defined by the inner edges 20 of layer 16.

Located under layer 16 is another layer of magnetically soft material. This other layer is comprised of disk-shaped propagation elements 22 which are contiguous with one another for maximum propagation density. As is apparent, the magnetic disks 22 are spatially displaced from the apertures 18 by one-half the diameter of the apertures. In FIG. 1A, the diameters of the apertures 18 and the disks 22 are the same, although it should be understood that the diameters of these elements can be different from one another.

The material comprising the magnetic layer 16 and the magnetic disk 22 is a material along which magnetic poles can be established and is preferably a magnetically soft material, such as NiFe. Any other magnetically soft material can also be used, as will be appreciated by those of skill in the art.

Bubble domains B propagate around channels 1 and 2 along paths 14 as the in-plane magnetic field H (FIG. 1B) reorientates in the manner shown. Field H is provided by a propagation field source 24, while the size of the domains B is stabilized by a magnetic field $H_z$ directed anti-parallel to the magnetization direction of the domains. Field $H_z$ is produced by a bias field source 26. Both field sources 24 and 26 are comprised of elements well known in this technology.

The two-layer, single sided propagation structure of FIG. 1A solves the problems mentioned with respect to the description of prior art high density structures. That is, domains in one propagation channel do not drift over to the other propagation channel, and domains in any propagation channel do not merely circulate around any of the propagation elements 18 or 22 while the propagation field H rotates in the plane of the magnetic layers. As will be more apparent from FIGS. 2A–2H and 3A–3H, the reason for this controlled propagation of domains B is that a restraining barrier is produced in magnetic medium 10 when it is formed on the underlays 16 and 22. This restraining barrier is a physical change in the profile of amorphous medium 10 which creates a magnetic barrier that prevents the domains from drifting from one propagation channel to the other as the magnetic field H rotates. Further, the domains prefer to stay under the magnetic material comprising layers 16 and 22 and thereby are transferred from a propagation element in one layer to the adjacent propagation element in the other layer in response to rotation of field H.

Fabrication (FIGS. 2A–2H and 3A–3H)

These figures illustrate fabrication steps which can be used to provide the propagation structure of FIG. 1A. FIGS. 2A–2H show the fabrication when the layer 16 is deposited first while FIGS. 3A–3H show the fabrication steps when the magnetic disks 22 are deposited first. For all of these FIGS., the fabrication of a portion of the structure of FIG. 1A taken along the line 2—2 is illustrated. The same reference numerals as were used in FIG. 1A will be used when functionally equivalent components are labelled. Thus, the magnetic layer which is later apertured will be designated by numeral 16.

Referring more particularly now to FIGS. 2A–2H, the fabrication steps will be described. In FIG. 2A, a glass substrate 28 is provided on which is deposited a magnetic layer 16. This is usually a magnetically soft material such as NiFe. The thickness of layer 16 is not critical, a thickness of approximately 200–800 Angstroms being sufficient for most amorphous magnetic bubble domain materials. Layer 16 is deposited on substrate 28 by any of a number of well known techniques, including evaporation or plating.

Figure 2B:
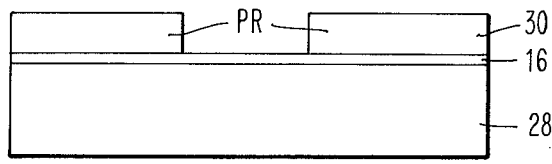

In FIG. 2B, a masking layer 30 is put on layer 16 in order to define the apertures 18 in layer 16 (FIG. 1A). Masking layer 30 is generally comprised of a resist layer which can be selectively exposed and developed.

Figure 2C:
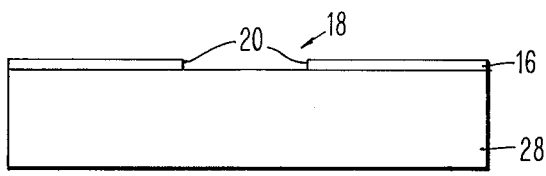

In FIG. 2C, a portion of layer 16 has been removed in order to define the apertures 18 therein. The inner edges of layer 16 which form the boundaries of apertures 18 are indicated by numeral 20.

Figure 2D:
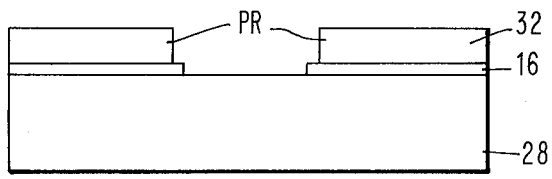

In FIG. 2D, a second masking layer 32 is provided on magnetic layer 16. Masking layer 32 is spatially displaced from the position of masking layer 30. This is not apparent from these FIGS., but it is apparent when it is known that masking layer 32 is used to define the magnetic disks 22 which are spatially displaced from the apertures 18 in layer 16. Masking layer 32 is conveniently a resist layer also.

Figure 2E:
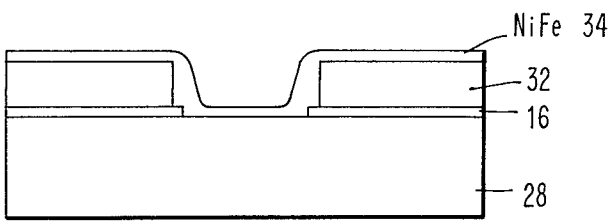

In FIG. 2E, a layer 34 of magnetically soft material, such as NiFe, is deposited over mask 32 and substrate 28, also to a thickness generally 200–800 A.

Figure 2F:
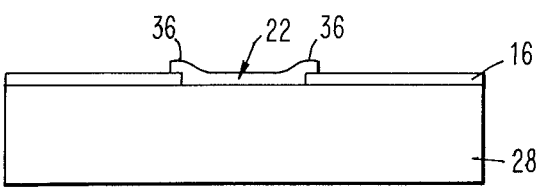

In FIG. 2F, conventional lift-off techniques are used to remove portions of layer 34 and masking layer 32. This leaves a structure having magnetic disks 22 and apertured layer 16. As will be noted, projections 36 are produced where the magnetic disks 22 overlap the magnetic layer 16, and at the edges of the propagation elements.

Figure 2G:
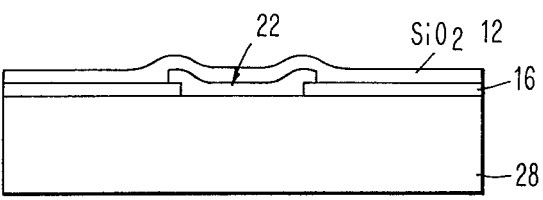

In FIG. 2G, the insulating layer 12 is deposited over the entire structure to smooth the contour of the structure and to move the magnetic propagation elements 16 and 22 further away from the amorphous magnetic material 10 which will be deposited over the entire structure.

Figure 2H:
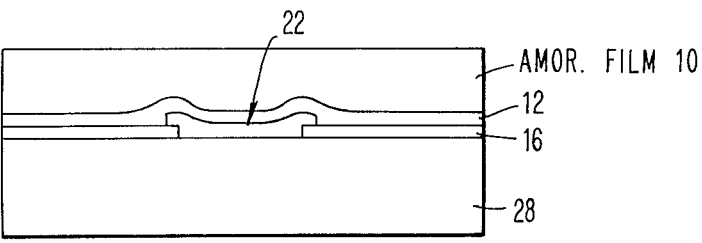

In FIG. 2H, the amorphous magnetic layer 10 is deposited over the entire structure of FIG. 2G. As is apparent, a change in the profile of the amorphous film is produced due to the projections 36. Additionally, the amorphous film will have profile changes where it lays over the edges 20 of apertures 18 in the regions of edges 20 which are not covered by magnetic layer 22. Therefore, boundary non-uniformities along the periphery of the propagation elements 18 and 22 will be provided which will cause profile changes in the amorphous film along the peripheries of the magnetic propagation elements 22 and the apertures 18. These discontinuities in the profile of the amorphous film serve as restraining boundaries to keep the bubble domains B from drifting to adjacent channels. Additionally, these boundaries insure that the bubble domains will transfer from one propagation element (disk or aperture) to the next propagation element (aperture or disk).

FIGS. 3A–3H illustrate fabrication steps used to provide the propagation structure except that the relative positions of layers 16 and 22 are reversed. In describing these FIGS., the same reference numerals will be used as were used in FIGS. 2A–2H. The order of the layers will be reversed, but their functions are the same, and therefore the same numerals will be used to define the same functional layers.

Figure 3A:
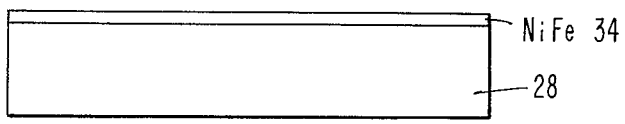
FIGS. 3A–3H show a technique for making a propagation structure similar to that of FIG. 1A, except that the relative positions of the two layers of propagation elements will be reversed when the fabrication steps of FIGS. 3A–3H are used.
Figure 3B:
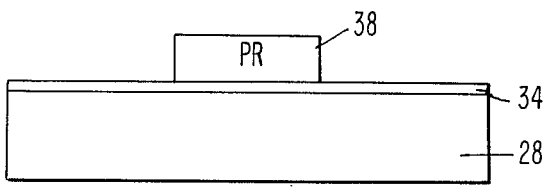

In FIG. 3A, the substrate 28 has deposited thereon a magnetic layer 34 which will later be used for the disk elements 22. Consequently, FIG. 3B shows the provision of a masking layer 38 which will be used as an etching mask.

Figure 3C:
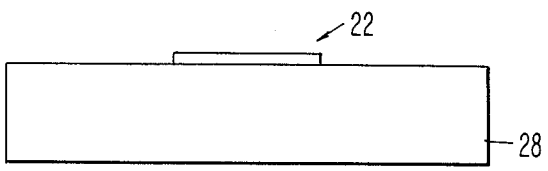

In FIG. 3C, the portions of layer 34 outside of mask 38 are removed by etching to leave the disk 22. The thickness of the disk 22 is not critical, and can be typically 200–800 Angstroms thick. However, thinner disks 22 can be used since these disks are easier to saturate than the larger magnetic layer 16.

Figure 3D:
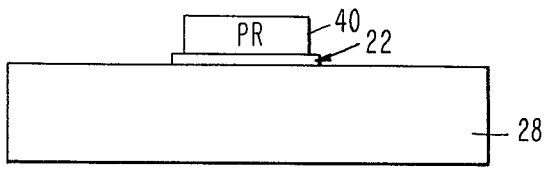
Figure 3E:
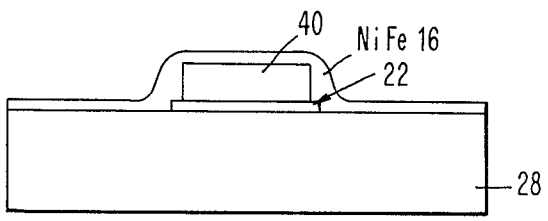

In FIG. 3D, a masking layer 40, typically comprised of a resist material, is deposited on the disk 22. This masking layer will be used to subsequently define the apertures 18 in the magnetic layer 16 to be deposited (FIG. 3E).

Figure 3F:
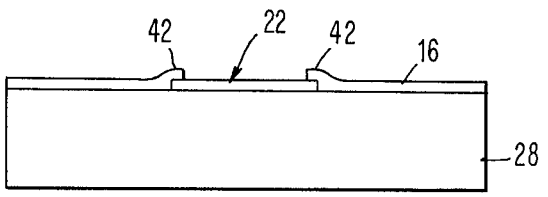

In FIG. 3F, the unwanted portions of layer 16 are removed by conventional lift-off techniques to provide a structure having apertured layer 16 and magnetic disk 22. The thickness of layer 16 is typically 200–800 Angstroms, although this can be varied. Again, projections 42 are produced where the layer 16 overlaps the underlying disk layer 22.

Figure 3G:
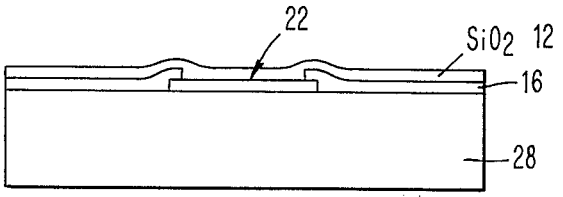
Figure 3H:
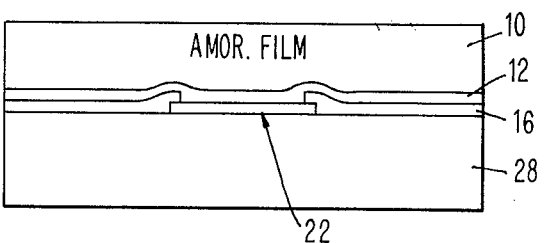

In FIG. 3G, the non-magnetic layer 12 is deposited over the underlying structure. Its function is the same as that mentioned previously. In FIG. 3H, the amorphous magnetic film 10 is deposited over layer 12 to provide the total structure. Again, discontinuities in the profile of the amorphous film 10 will be produced due to the projections 42 and to the edges of the disk 22 which are not covered by magnetic layer 16, as well as by the edges 20 of magnetic layer 16 which do not overlie the disk 22. These profile discontinuities in the film 10 serve as magnetic restraining barriers so that the bubble domains propagate along the directions indicated by arrow 14 (FIG. 1A) without drifting to adjacent channels and without circulating continually around any of the propagation elements 18 or 22.

ALTERNATE GEOMETRIES (FIG. 4)

Although generally curved geometries have been illustrated for the propagation elements of the two-layered propagation structure, other geometries can be used for these elements. For instance, FIG. 4 illustrates the use of diamond shaped propagation elements in the top magnetic layer 44 and in the bottom magnetic layer 46. The magnetic layer 44 contains apertures 48, while magnetic layer 46 is comprised of diamond shaped elements 50.

The propagation structure of FIG. 4 is made in the same manner as that described previously. Additionally, the operation of this propagation structure to move magnetic domains in an overlying amorphous magnetic medium is similar to that described with respect to the movement of domains in FIG. 1A. That is, domains will move in the amorphous magnetic material in the general direction indicated by arrow 52, as magnetic field H (FIG. 1B) rotates in the plane of the amorphous magnetic medium. Of course, by reversing the direction of rotation of the field H, propagation in a direction opposite to that indicated by arrow 52 will be obtained.

The propagation structure can also comprise a single layer 16 of apertured magnetic material, if the non-uniform smoothness of the amorphous layer is sufficient to provide a restraining barrier to bubble domain movement. As an example, bubble domains were propagated in a structure comprising an amorphous bubble domain film having a composition of Gd—Co—Mo and a thickness of 912 nm which was deposited on an apertured permalloy layer having a thickness of 30 nm. No intermediate layer 12 was used.

It has been found that the "bump" in the amorphous material which is produced by the underlying magnetic propagation elements provides a good magnetic barrier for proper bubble domain propagation of this "bump" is a step of about 1000–4000 A. Since the magnetic layers are usually about 100–400 A thick, a non-magnetic material, such as $SiO_2$, is often deposited under the magnetic layer to create a higher step. For instance, a 2000 A layer of $SiO_2$ can be deposited on the substrate 28 after which the magnetic propagation layer(s) is deposited.

As was mentioned, the individual magnetic layers 16 and 22 are about 100–400 A thick. If these layers are thicker than this, bubble domains tend to be repelled from the cusps of the disk propagation elements. Therefore, when only a single magnetic layer 16 is used for propagation, the bubble domains will sometimes have a tendency to move from one propagation channel to another if the magnetic layer is too thick.

What has been shown is a magnetic propagation structure for moving magnetic bubble domains in amorphous magnetic media. The structure is characterized by being located on a single side of the amorphous magnetic material and is comprised of two magnetic layers. These magnetic layers each contain propagation elements which define the path of the magnetic bubble domains in the amorphous material as an in-plane magnetic field reorients. Because the amorphous magnetic material is deposited over the propagation elements, discontinuities will be produced in the topology of the amorphous film, which will act as a restraining barrier to prevent bubble domains from drifting erratically in the amorphous material and from being hung up at any stage of the propagation path. Consequently, the structure can be used with any type of contiguous propagation elements in order to provide very high density storage and propagation.

What is claimed is:

1. A structure for moving magnetic bubble domains in an amorphous medium in which such domains exist in response to the reorientations of a magnetic field, comprising:
    a first magnetic layer located on one side of said amorphous magnetic medium for defining propagation elements,
    a second magnetic layer located on the same side of said amorphous medium as said first magnetic layer and for defining second propagation elements, the propagation elements in said second magnetic layer being laterally displaced from the propagation elements in said first magnetic layer.

2. The structure of claim 1, where said propagation elements in each layer are contiguous to one another.

3. The structure of claim 1, where said amorphous film is located over said first and second layers and has a non-uniform smoothness profile determined by the edges of said propagation elements.

4. The structure of claim 1, where said propagation elements have generally curved shapes.

5. The structure of claim 4, where said curved shapes are circular.

6. The structure of claim 1, where said propagation elements in said first layer are defined by apertures in said layer while the propagation elements in said second layer are solid magnetic elements without apertures.

7. A magnetic bubble domain structure, comprising:
    a first layer of magnetic material which is patterned to define first propagation elements,
    a second layer of magnetic material located over said first layer and patterned to define second propagation elements, and
    an amorphous magnetic material located over said first and second magnetic layers, said amorphous magnetic material having a non-uniform smoothness determined by the edges of said propagation elements.

8. The structure of claim 7, where said first propagation elements are laterally displaced from said second propagation elements.

9. The structure of claim 7, where said first propagation elements are contiguous elements and said second propagation elements are contiguous elements.

10. The structure of claim 7, where said first layer has apertures therein to define said first propagation elements.

11. The structure of claim 7, where said second layer has apertures therein to define said second propagation elements.

12. The structure of claim 7, further including a non-magnetic layer located between said amorphous material and said second layer.

* * * * *